(12) United States Patent
Kim et al.

(10) Patent No.: US 8,077,269 B2
(45) Date of Patent: Dec. 13, 2011

(54) ARRAY SUBSTRATE AND DISPLAY PANEL HAVING THE SAME

(75) Inventors: Su-Jeong Kim, Seoul (KR); Hye-Ran You, Incheon (KR); Yoon-Sung Um, Yongin-si (KR); Jae-Jin Lyu, Yongin-si (KR); Keun-Chan Oh, Cheonan-si (KR); Jong-Ho Son, Seoul (KR)

(73) Assignee: Samsung Electronics Co., Ltd. (KR)

( * ) Notice: Subject to any disclaimer, the term of this patent is extended or adjusted under 35 U.S.C. 154(b) by 330 days.

(21) Appl. No.: 12/548,660

(22) Filed: Aug. 27, 2009

(65) Prior Publication Data

US 2010/0123845 A1   May 20, 2010

(51) Int. Cl.
*G02F 1/1343* (2006.01)
*G02F 1/1368* (2006.01)
*H01L 21/77* (2006.01)

(52) U.S. Cl. .......... 349/46; 349/141; 349/187; 438/151; 438/30; 257/E21.535

(58) Field of Classification Search .............. 349/158, 349/160, 143, 147, 138, 139, 122, 56, 141, 349/42, 46, 187; 438/151, 30; 257/E21.535
See application file for complete search history.

(56) References Cited

U.S. PATENT DOCUMENTS

| | | | |
|---|---|---|---|
| 2005/0051842 A1* | 3/2005 | Liou et al. | 257/347 |
| 2008/0186434 A1* | 8/2008 | Yun et al. | 349/106 |
| 2008/0239187 A1* | 10/2008 | Yang et al. | 349/44 |
| 2008/0297675 A1* | 12/2008 | Kim | 349/38 |
| 2010/0019998 A1* | 1/2010 | You et al. | 345/87 |
| 2010/0123845 A1* | 5/2010 | Kim et al. | 349/46 |

* cited by examiner

*Primary Examiner* — Brian Healy
(74) *Attorney, Agent, or Firm* — Cantor Colburn LLP

(57) ABSTRACT

An array substrate includes; a thin-film transistor layer including; a gate line, a data line disposed substantially perpendicular to the gate line, and a switching element connected to the gate line and the data line, a gate insulation layer disposed on the gate line, a passivation layer disposed on the thin-film transistor layer, a shielding electrode disposed on the passivation layer, an insulation layer disposed on the shielding electrode; and a pixel electrode including a micro-slit pattern, the pixel electrode being disposed on the insulation layer and electrically connected to the switching element, wherein the shielding electrode is vertically aligned with the data line and the shielding electrode blocks an electromagnetic fringe field of the data line from effecting the pixel electrode.

20 Claims, 21 Drawing Sheets

ARRAY SUBSTRATE AND DISPLAY PANEL HAVING THE SAME

This application claims priority to Korean Patent Application No. 2008-113237, filed on Nov. 14, 2008, and all the benefits accruing therefrom under 35 U.S.C. §119, the contents of which in its entirety are herein incorporated by reference.

BACKGROUND OF THE INVENTION

1. Field of the Invention

The present invention relates to a display and, more particularly, to a display device having a display panel including an array substrate exhibiting greater transmittance.

2. Description of the Related Art

Generally, an image displayed by a typical liquid crystal display ("LCD") device suffers from distortion according to the angle from which the image is viewed. Such distortion can be overcome by employing patterned vertical alignment ("PVA") techniques in which the PVA LCD device has a patterned pixel electrode in a lower substrate and a patterned common electrode in an upper substrate. When an electric field is applied to a liquid crystal layer interposed between the lower substrate and the upper substrate, an electromagnetic fringe field is generated at an edge portion of the patterned pixel electrode and the patterned common electrode to align liquid crystal molecules along a plurality of directions, also called domains.

Recently, a micro-slit structure of the PVA LCD device has been developed. In the micro-slit structure of the PVA LCD device, micro-slits are formed in the pixel electrode of the lower substrate as a strip-like pattern which extends in one direction and sustains the same voltage level. However, the use of a micro-slit structure in the pixel electrode excludes the use of patterns on common electrode in the upper substrate. The micro-slits are finely formed so as to increase the transmittance of the LCD device. However, the ability to finely form the micro-slits on the pixel electrode has limits from the standpoint of a processing technology, e.g., manufacturing limitations. The transmittance in a circumference portion of micro-slits especially needs to be improved.

BRIEF SUMMARY OF THE INVENTION

The present invention provides a display device having an array substrate exhibiting enhanced transmittance.

In one exemplary embodiment of the present invention, an array substrate includes; a thin-film transistor ("TFT") layer including a gate line, a data line disposed substantially perpendicular to the gate line and a switching element connected to the gate line and the data line, a gate insulation layer disposed on the gate line, a passivation layer disposed on the thin-film transistor layer, a shielding electrode disposed on the passivation layer, an insulation layer disposed on the shielding electrode, and a pixel electrode including a micro-slit pattern, the pixel electrode being disposed on the insulation layer and electrically connected to the switching element, wherein the shielding electrode is vertically aligned with the data line and the shielding electrode blocks an electromagnetic fringe field of the data line from effecting the pixel electrode.

In another exemplary embodiment, a display panel includes; an array substrate includes; a thin-film transistor ("TFT") layer including a gate line, a data line disposed substantially perpendicular to the gate line and a switching element connected to the gate line and the data line, a gate insulation layer disposed on the gate line, a passivation layer disposed on the thin-film transistor layer, a shielding electrode disposed on the passivation layer, an insulation layer disposed on the shielding electrode, and a pixel electrode including a micro-slit pattern, the pixel electrode being disposed on the insulation layer and electrically connected to the switching element, wherein the shielding electrode is vertically aligned with the data line and the shielding electrode blocks an electromagnetic fringe field of the data line from effecting the pixel electrode, an opposite substrate coupled to the array substrate, the opposite substrate including a common electrode disposed substantially opposite to the pixel electrode, and a liquid crystal layer interposed between the opposite substrate and the array substrate.

In one exemplary embodiment, the shielding electrode may be vertically aligned with the gate line, the switching element and an end portion of micro-slit pattern of the pixel electrode. In one exemplary embodiment, the shield electrode is made of transparent conductive material, exemplary embodiments of which include indium tin oxide ("ITO") or indium zinc oxide ("IZO").

In one exemplary embodiment, the micro-slit pattern comprises an electrode part and an intermediate portion formed between adjacent electrode parts, the widths of the electrode part and the intermediate portion may be about 2 μm to about 10 μm, respectively. In one exemplary embodiment, the width of the electrode part is substantially larger than the width of the intermediate portion. In one exemplary embodiment, the pixel electrode including micro-slit pattern may be electrically connected to the data line via a hole formed through the insulation layer and the passivation layer.

In one exemplary embodiment, the shielding electrode may be electrically connected to a storage line formed on the same layer as the gate line via a hole formed through the gate insulation layer and the passivation layer. In other exemplary embodiment, the shielding electrode may be electrically connected to the common electrode of the opposite substrate via a conductive material across the liquid crystal layer.

BRIEF DESCRIPTION OF THE DRAWINGS

The above and other aspects, advantages and features of the present invention will become more readily apparent by reference to the following detailed description when considered in conjunction with the accompanying drawings, wherein.

DETAILED DESCRIPTION OF THE INVENTION

Figure 1:
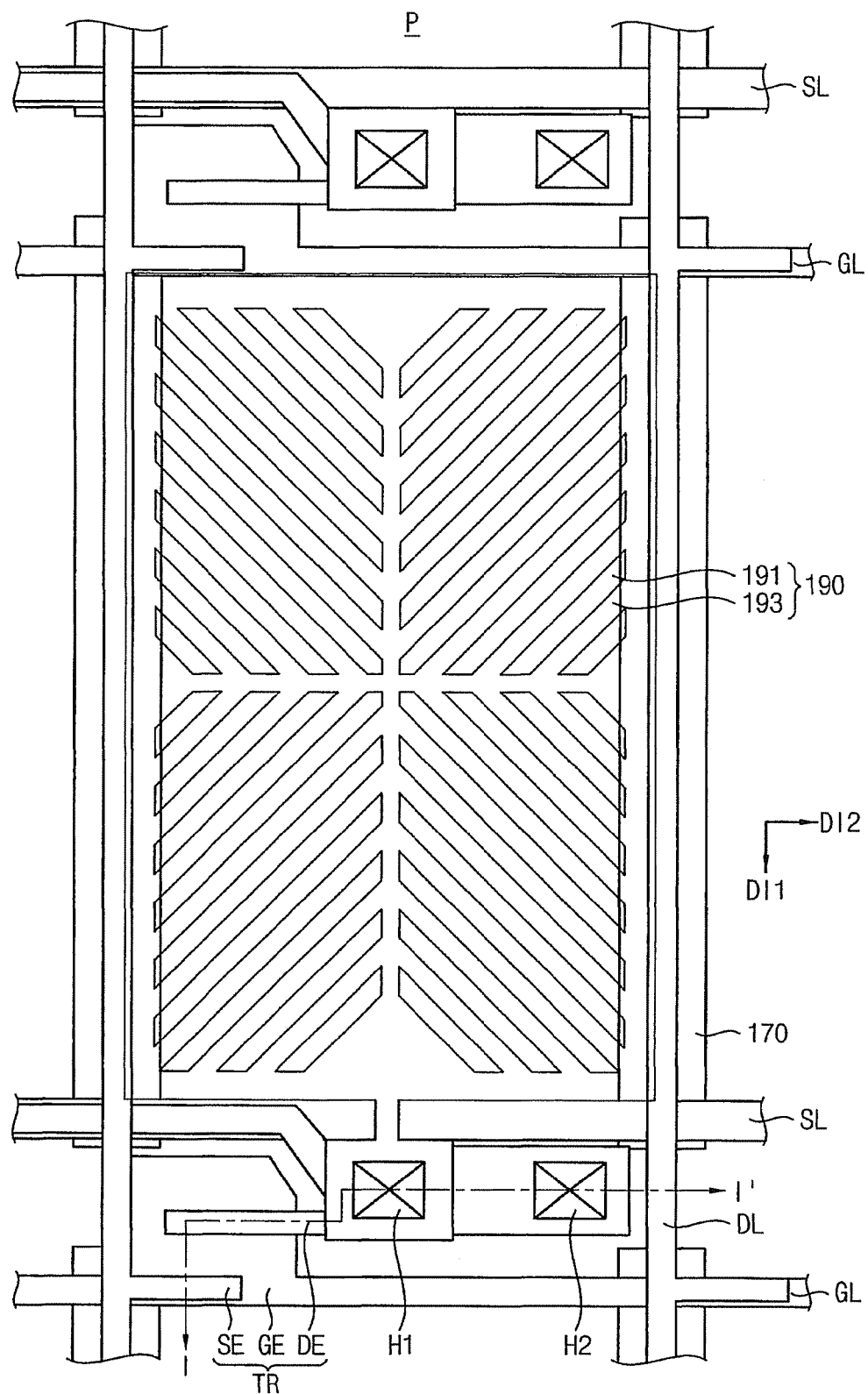
FIG. 1 is a top plan layout view schematically illustrating an exemplary embodiment of a display panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein. All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Embodiment 1

Figure 2:
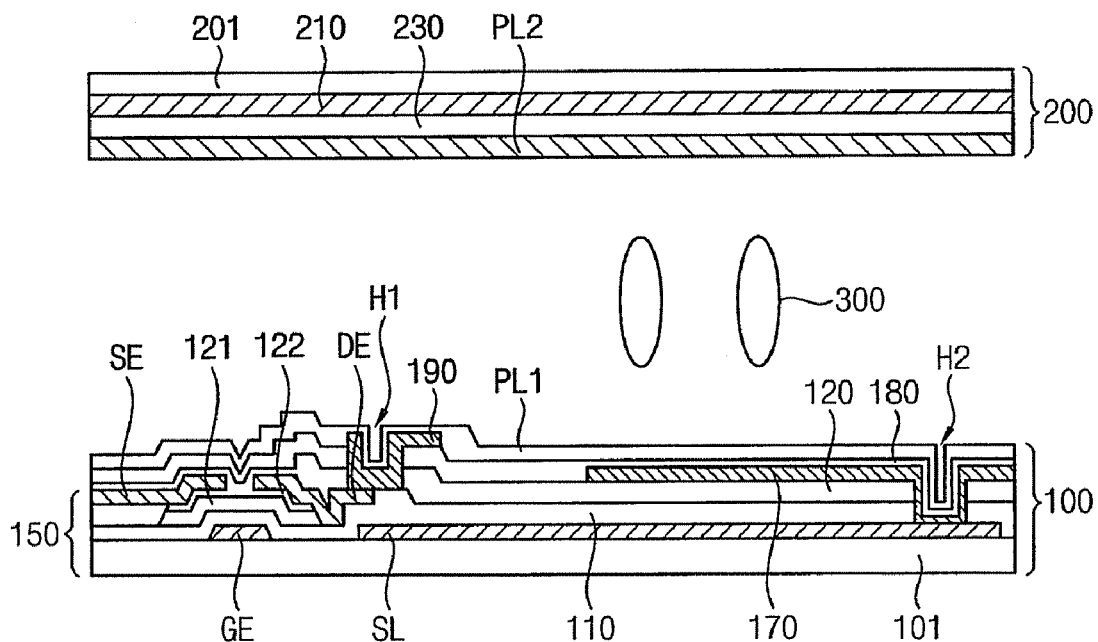
FIG. 2 is a cross-sectional view taken along line I-I' of FIG. 1.

FIG. 1 is a top plan layout view schematically illustrating an exemplary embodiment of a display panel according to the present invention. FIG. 2 is a cross-sectional view taken along line I-I' of FIG. 1.

Referring to FIGS. 1 and 2, the exemplary embodiment of a display panel includes an array substrate 100, an opposite substrate 200, and a liquid crystal layer 300.

The array substrate 100 includes a first base substrate 101, a thin-film transistor ("TFT") layer 150, a passivation layer 120, a shielding electrode 170, a second insulation layer 180, and a pixel electrode 190. The TFT layer 150, the passivation layer 120, the shielding electrode 170, the second insulation layer 180 and a pixel electrode 190 are formed on the first base substrate 101. The TFT layer 150 includes a gate line GL, a data line DL, a storage line SL, a switching element TR.

For example, in one exemplary embodiment a gate metal pattern may be formed on the first base substrate 101. The gate metal pattern includes the gate line GL and storage line SL extending along a first direction and a gate electrode GE of the switching element TR electrically connected to the gate line GL.

A gate insulation layer 110 is formed on the gate metal pattern. A channel layer including a semiconductor layer 121, and in certain exemplary embodiments an ohmic contact layer 122, is formed on the gate insulation layer 110.

A source metal pattern is formed on the channel layer. The source metal pattern includes a source electrode SE of the switching element TR and the data line DL extended along a second direction substantially perpendicular to the first direction. The source metal pattern further includes a drain electrode DE of the switching element TR.

A passivation layer 120 is formed on the TFT layer 150. The passivation layer 120 has a first hole H1 exposing the drain electrode DE of the switching element TR therethrough.

A shielding electrode 170 is formed on the passivation layer 120. Exemplary embodiments of the shielding electrode 170 include an optically transparent and electrically conductive material, exemplary embodiments of which may include indium tin oxide ("ITO") or indium zinc oxide ("IZO") or other similar materials. The shielding electrode 170 is formed in a pixel area corresponding to a unit pixel. Exemplary embodiments of the pixel area may have a rectangular shape as shown in FIG. 1. Alternative exemplary embodiments include configurations wherein the pixel area may have other shapes such as a zigzag shape and so on. The shielding electrode 170 is vertically aligned with the data line DL and the gate line GL and shields the pixel area from a lateral electromagnetic field generated by the gate line GL and the data line DL. An edge portion of a micro-slit pattern of the pixel electrode 190 overlaps with the projection area of the shielding electrode 170, as will be discussed in more detail below. Transmittance may be enhanced at an edge portion of the micro-slit pattern, so that the total transmittance of the display can be enhanced.

In the present exemplary embodiment, the shielding electrode 170 is electrically connected to the storage line SL through a second hole H2 in both the passivation layer 120 and the gate insulation layer 110. When a common voltage signal is applied to the SL line, the shielding electrode 170 receives a common voltage Vc. In the present exemplary embodiment, the common voltage Vc is substantially equal to a common voltage Vcom applied to a common electrode 230 of the opposite substrate 200.

The second insulation layer 180 is formed on the shielding electrode 170. The second insulation layer 180 may be patterned with an opening corresponding with the first hole H1.

A pixel electrode 190 is formed on the second insulation layer 180. In one exemplary embodiment, the pixel electrode 190 includes the optically transparent and electrically conductive material. The pixel electrode 190 is electrically connected to the drain electrode DE of the switching element TR through the first hole H1.

The pixel electrode 190 may have the micro-slit pattern as discussed above. The micro-slit pattern may include an electrode part 191 formed from the optically transparent and electrically conductive material, and an intermediate portion 193 exposing the second insulation layer 180 between adjacent electrode parts 191. For example, in one exemplary embodiment the widths of the electrode part 191 and the intermediate portion 193 are about 2 μm to about 10 μm, respectively. In one exemplary embodiment, the width of the electrode part 191 may be substantially equal to or larger than that of the intermediate portion 193.

A first alignment film PL1 is formed on the pixel electrode 190 of the array substrate 100. A second alignment film PL2 is formed on the common electrode 230 of the opposite substrate 200.

In the present exemplary embodiment, liquid crystal molecules 300 are aligned in a vertical direction, e.g., a direction between the array substrate 100 and the opposite substrate 200, when the voltage is not applied thereto.

When the switching element TR is turned on, the pixel electrode 190 receives a data voltage Vd transferred from the data line DL. An effective voltage difference ΔV between the data voltage Vd applied to the pixel electrode 190 through the switching element TR and a common voltage Vcom applied to a common electrode 230 of the opposite substrate 200 may be set to be a predetermined voltage. In one exemplary embodiment, the voltage difference ΔV is greater than 0 V.

Liquid crystal molecules disposed between the adjacent electrode parts 191 collide with each other and align substantially parallel to a longitudinal direction of the micro-slit pattern, so that a direction of liquid crystal molecules may be controlled by the application of the voltage difference ΔV.

An exemplary embodiment of the opposite substrate 200 includes a second base substrate 201, a color filter layer 210 formed on the second base substrate 201, and a common electrode 230. Alternative exemplary embodiments include configurations wherein the color filter layer 210 is formed on the array substrate 100.

The color filter layer 210 is formed in alignment with the pixel electrode 190. In one exemplary embodiment, the common electrode 230 formed on the color filter layer 210 may include an optically transparent and electrically conductive material, similar to the pixel electrode 190. In the present exemplary embodiment, the common electrode 230 is not patterned, and is formed on the second base substrate 201. In one exemplary embodiment, the common electrode 230 may be planarized with a uniform thickness. A second alignment film PL2 is formed on the common electrode 230.

FIGS. 3A, 4A, 5A, 6A and 7A are top plan layout views of an exemplary embodiment of an array substrate illustrating an exemplary embodiment of a manufacturing process of the exemplary embodiment of an array substrate of FIG. 1, and FIGS. 3B, 4B, 5B, 6B and 7B are cross-sectional views of an exemplary embodiment of an array substrate illustrating an exemplary embodiment of a manufacturing process of an array substrate of FIG. 2.

Figure 3A:
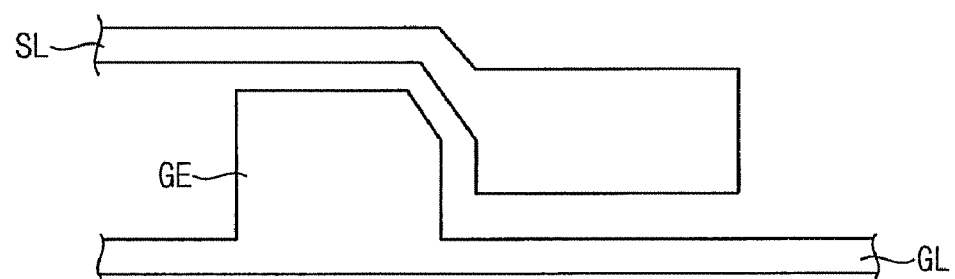
FIGS. 3A, 4A, 5A, 6A and 7A are top plan layout views of an exemplary embodiment of an array substrate illustrating an exemplary embodiment of a manufacturing process of the exemplary embodiment of an array substrate of FIG. 1.
Figure 3B:
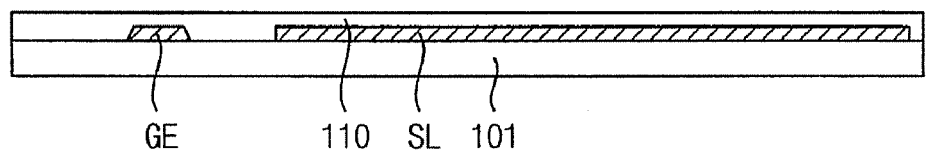
FIGS. 3B, 4B, 5B, 6B and 7B are cross-sectional views of an exemplary embodiment of an array substrate illustrating an exemplary embodiment of a manufacturing process of the exemplary embodiment of an array substrate of FIG. 2.

Referring to FIGS. 3A and 3B, a gate metal layer is deposited on the first base substrate 101, and the gate metal layer is patterned to form a gate metal pattern. The gate metal pattern includes the gate and storage lines GL and SL extending along the first direction, the gate electrode GE of the first switching element TR electrically connected to the gate line GL.

The gate insulation layer 110 is formed on the gate metal pattern. Exemplary embodiments of the gate insulation layer 110 may include silicon nitride (SiNx) and silicon oxide (SiOx). In one exemplary embodiment, the gate insulation layer 110 may be formed to a thickness of about 4,000 Å.

Figure 4A:
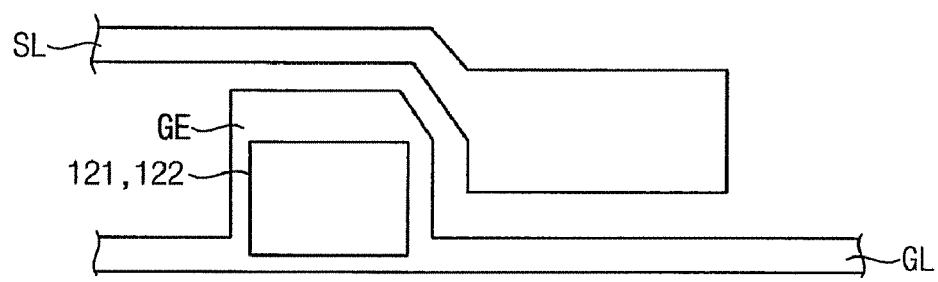
Figure 4B:
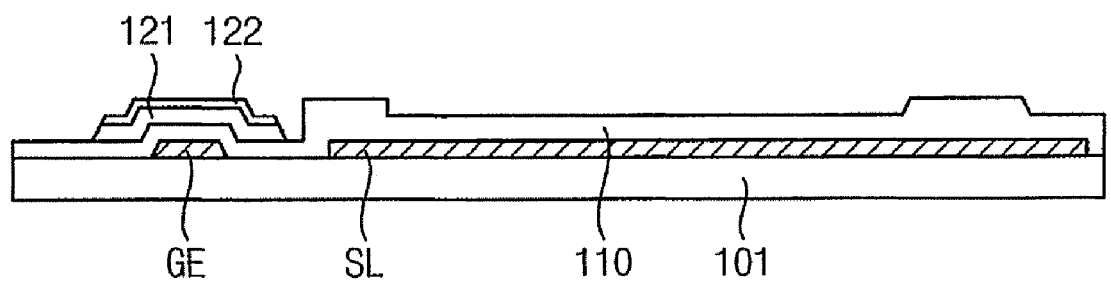

Referring to FIGS. 4A and 4B, a semiconductor layer 121 including amorphous silicon (a-Si) and a channel layer including an ohmic contact layer 122 doped with n+ ions at a high concentration are formed on the gate insulation layer 110.

Figure 5A:
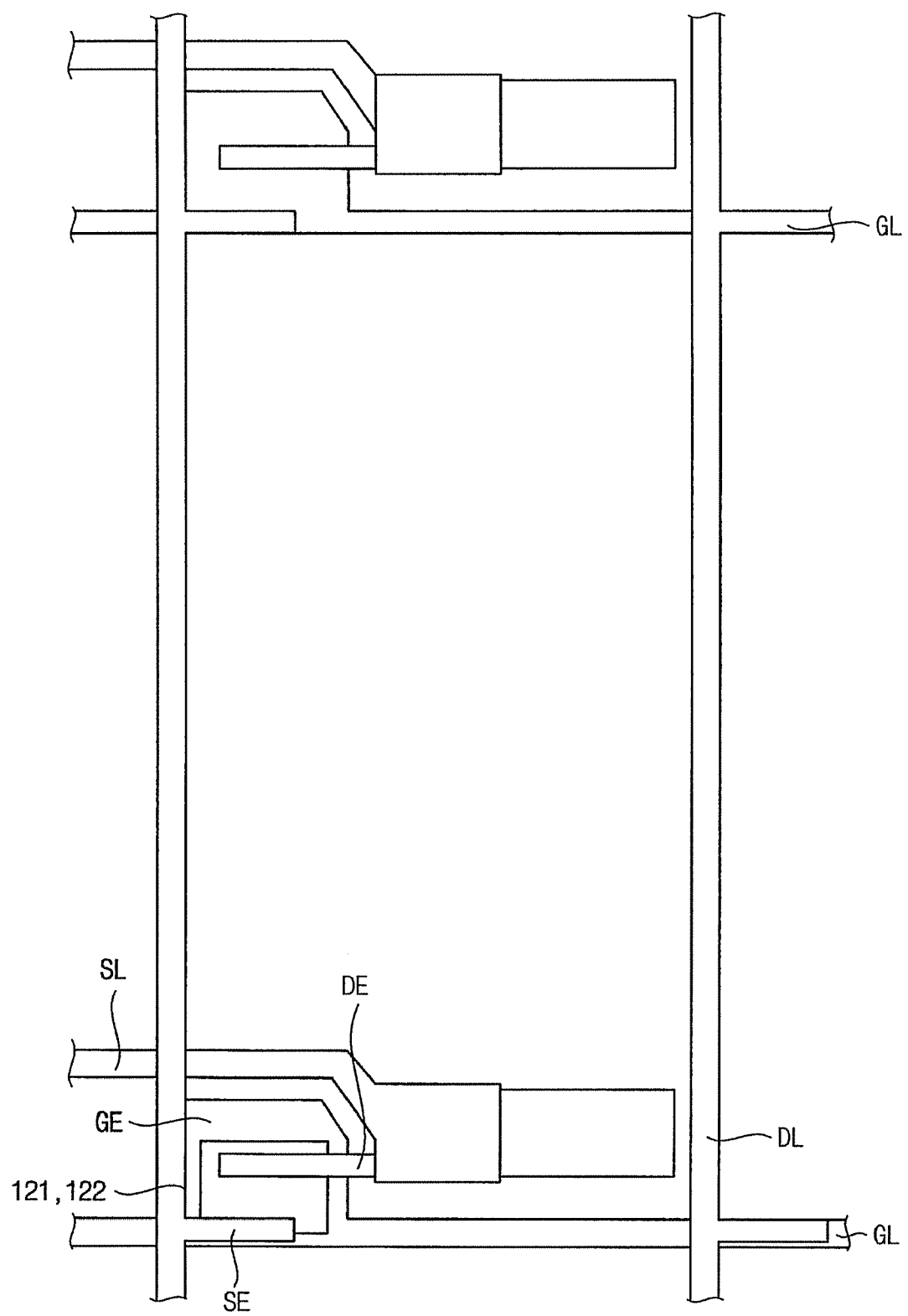
Figure 5B:
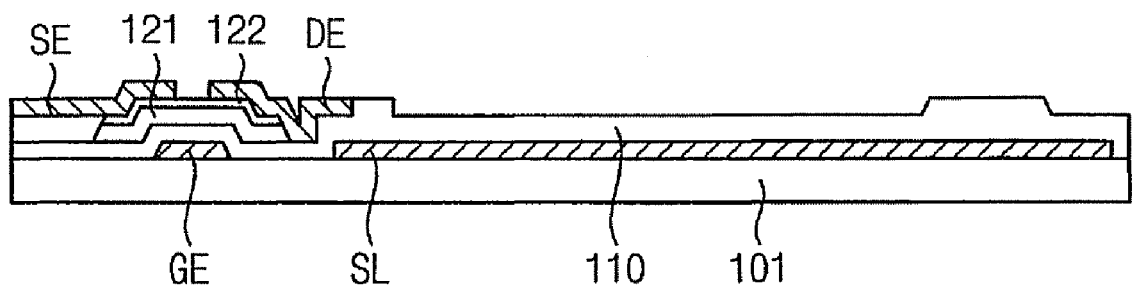

Referring to FIGS. 5A and 5B, a data metal layer is deposited on the gate insulation layer 110 and the semiconductor layer 121, and the data metal layer is patterned to form a data metal pattern. The data metal pattern includes the data line DL extending along the second direction and source/drain electrodes of the switching element TR. The source electrode SE is electrically connected to the data line DL.

A passivation layer 120 is formed on the data metal pattern. In one exemplary embodiment, the passivation layer 120 may include silicon nitride (SiNx). In one exemplary embodiment, the passivation layer 120 may be formed to a thickness of about 2,000 Å.

A TFT layer 150 is formed on the first base substrate 101 through the above manufacturing process.

Figure 6A:
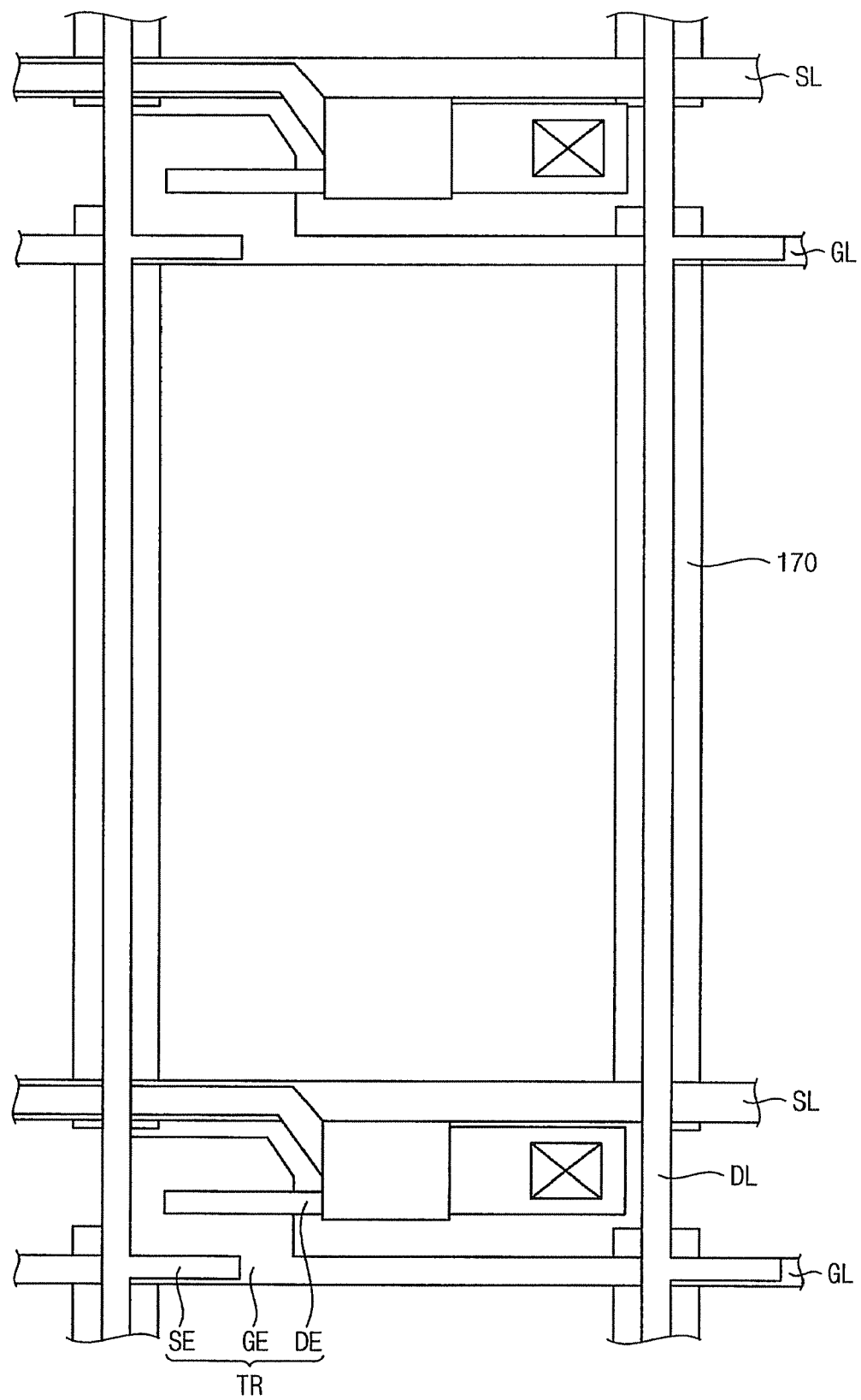
Figure 6B:
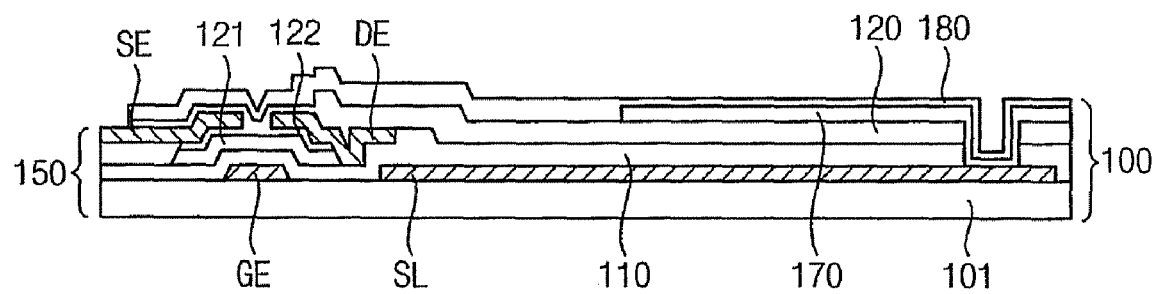

Referring to FIGS. 6A and 6B, the passivation layer 120 and the gate insulation layer 110 disposed over the storage line SL is removed, e.g., via etching. An optically transparent and electrically conductive material is deposited on the passivation layer 120, and then the optically transparent and electrically conductive material is patterned to form the shielding electrode 170. For example, as discussed above, exemplary embodiments of the electrically conductive material may include ITO or IZO. Alternative exemplary embodiments include configurations wherein a conductive but opaque material, for example Ti, Mo, Al metal can be applied in addition/alternative to the electrically conductive material.

The second insulation layer 180 is formed on the shielding electrode 170. Exemplary embodiments include configurations wherein the second insulation layer 180 is formed from an organic insulation material and may be formed to a thickness of about 2,000 Å.

Figure 7A:
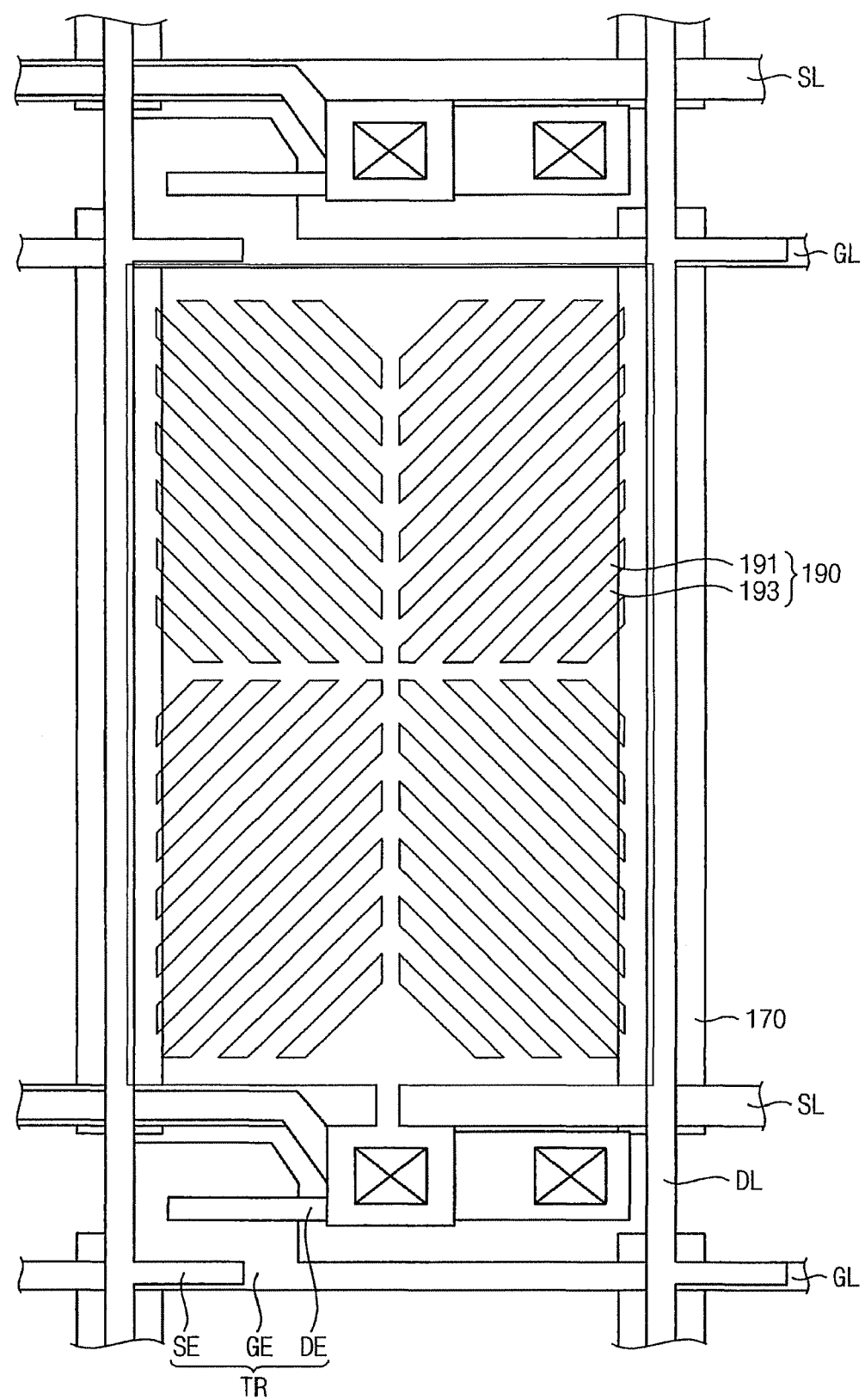
Figure 7B:
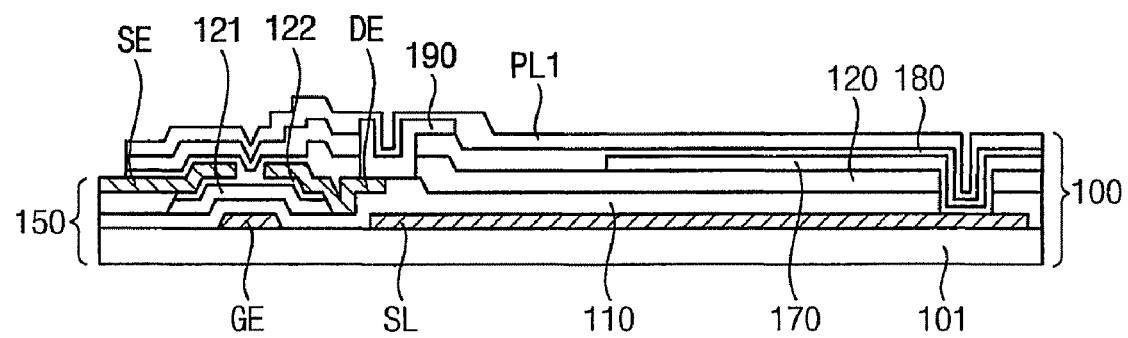

Referring to FIGS. 7A and 7B, the insulation layer 180 and the passivation layer 120 corresponding to the hole H1 are etched exposing the drain electrode DE therethrough.

An optically transparent and electrically conductive material is deposited on the second insulating layer 180 covering the first hole H1, and then the optically transparent and electrically conductive material is patterned to form the pixel electrode 190. The pixel electrode 190 may have a micro-slit pattern as described above. The micro-slit pattern may include the electrode part 191 (formed from the optically transparent and electrically conductive material), and the intermediate portion 193 exposing the insulation layer 180 between adjacent electrode parts 191. For example, in one exemplary embodiment, the widths of the electrode part 191 and the intermediate portion 193 are about 2 μm to about 10 μm, respectively. In one exemplary embodiment, the width of the electrode part 191 may be substantially equal to or larger than that of the intermediate portion 193.

The pixel electrode 190 makes contact with the drain electrode DE through the hole H1 to be electrically connected to the switching element TR. The pixel electrode 190 makes contact with the passivation layer 120 through an opening of the shielding electrode 170. Thus, a storage capacitor charging a voltage induced on the liquid crystal layer 300 may be formed between storage line SL and the pixel electrode 190. The storage capacitor may charge predetermined charges in response to the data voltage Vd applied to the pixel electrode 190 and the common voltage Vcom applied to the storage line SL.

An alignment film PL1 is formed on the pixel electrode 190.

In an exemplary embodiment, in order to form the TFT layer 150, the gate metal layer, the channel layer, the source metal layer and the passivation layer are patterned through four masks. However, alternative exemplary embodiments include configurations wherein the TFT layer 150 may be formed through three masks. For example, in the exemplary embodiment wherein the three masks are used for forming the TFT layer 150, the channel layer and the source metal layer may be patterned through one mask.

Embodiment 2

Figure 8:
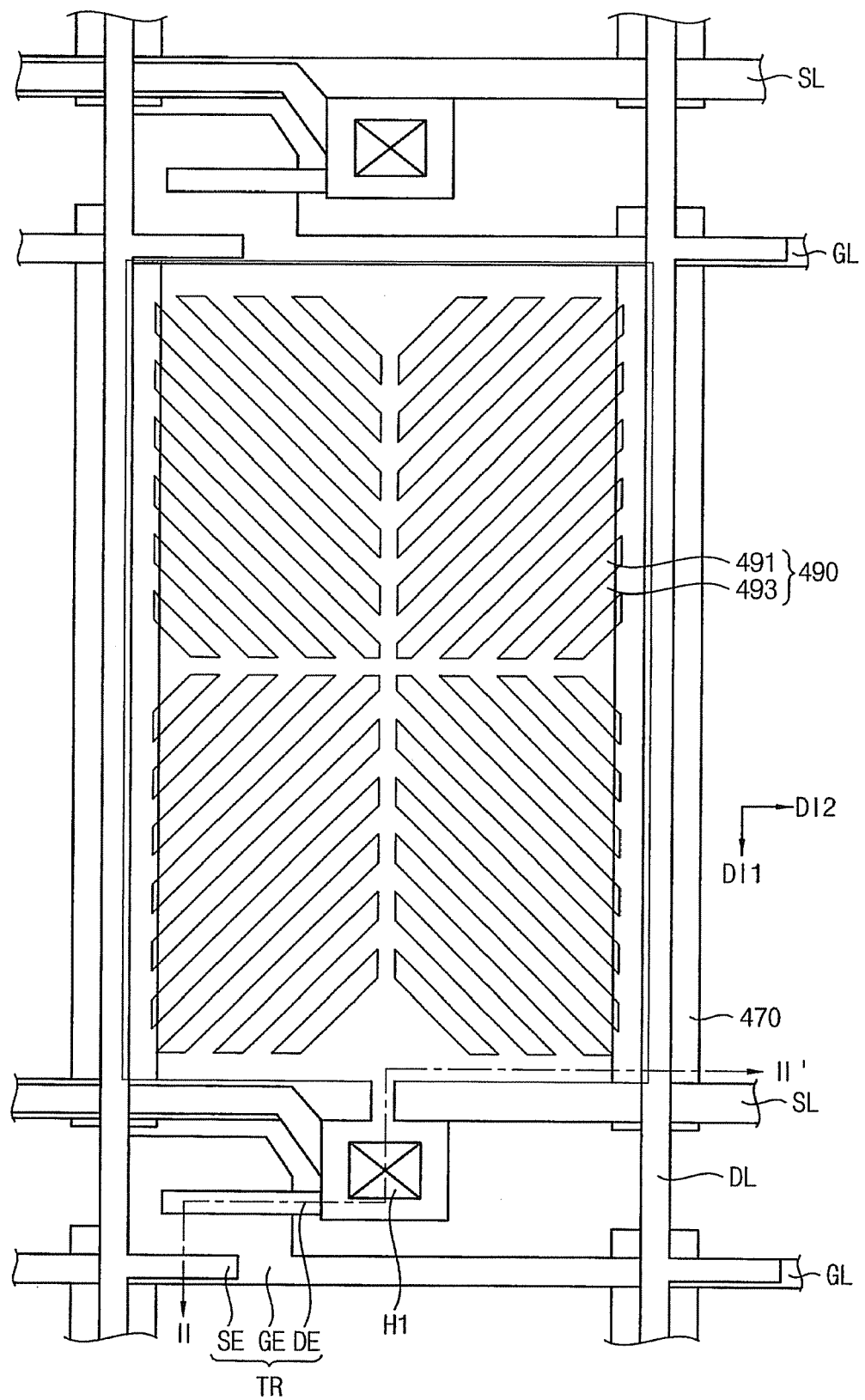
FIG. 8 is a top plan layout view schematically illustrating another exemplary embodiment of a display panel according to the present invention.
Figure 9:
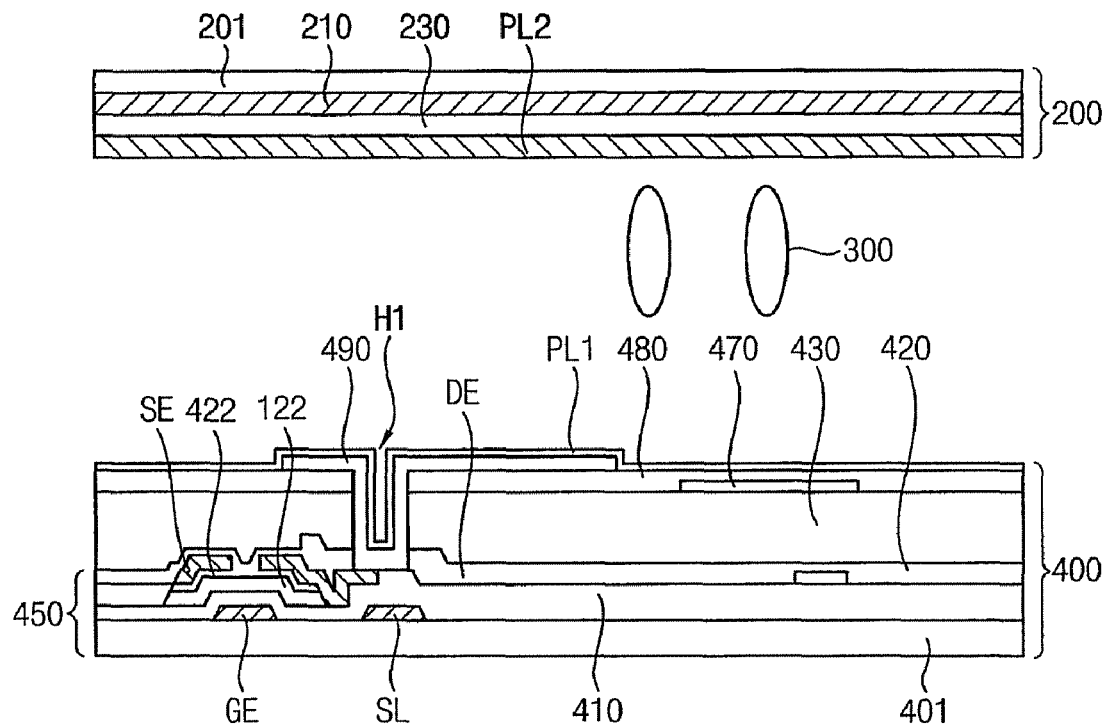
FIG. 9 is a cross-sectional view taken along line II-II' of FIG. 8.

FIG. 8 is a top plan layout view schematically illustrating another exemplary embodiment of a display panel according to the present invention. FIG. 9 is a cross-sectional view taken along line II-II' of FIG. 8.

Referring to FIGS. 8 and 9, the display panel includes an array substrate 400, an opposite substrate 200 and a liquid crystal layer 300 interposed between the array substrate 400 and the opposite substrate 200. The current exemplary embodiment of a display panel is substantially the same as the previous exemplary embodiment of a display panel as described in FIGS. 1 and 2 except for the array substrate 400. Thus, a detailed description of the substantially similar portions will be omitted and the array substrate 400 will be described.

The array substrate 400 includes a first base substrate 401, a TFT layer 450 formed on the first base substrate 401, a passivation layer 400, an organic layer 430, a shielding electrode 470, an insulation layer 480 and a pixel electrode 490. The TFT layer 450 includes a gate line GL, a data line DL, a storage line SL and a switching element TR.

A gate metal pattern is formed on the first base substrate 401. The gate metal pattern includes the gate line GL and storage line SL extending along a first direction, and a gate electrode GE of the switching element TR electrically connected to the gate line GL.

A gate insulation layer 410 is formed on the gate metal pattern. A channel layer is formed on the gate insulation layer 410, the channel layer including a semiconductor layer 421 and an ohmic contact layer 422. Alternative exemplary embodiments include configurations wherein the ohmic contact layer 422 may be omitted.

A source metal pattern is formed on the channel layer. The source metal pattern includes the data line DL extended along a second direction substantially perpendicular to the first direction, a source electrode SE of the switching element TR electrically connected to the data line DL and a drain electrode DE spaced apart from the source electrode SE.

A passivation layer 420 is formed on the source metal pattern. A first hole H1 is formed through the passivation layer 420, which exposes the drain electrode DE of the switching element TR therethrough.

An organic layer 430 is formed on the passivation layer 420.

A shielding electrode 470 is formed on the organic insulation layer 430. In the present exemplary embodiment, the shielding electrode includes an optically transparent and electrically conductive material, exemplary embodiments of which may include ITO, IZO or other similar materials as discussed above. In the present exemplary embodiment, the shielding electrode 470 is not electrically connected to the storage line SL. Differently from the previous embodiment, the shielding electrode can be electrically floated because it is isolated by the organic layer 430 from a disturbed signal for example, a data signal from the data signal line DL.

A insulation layer 480 is formed on the shielding electrode 470. A first hole H1 is formed through the insulation layer 480 exposing the drain electrode DE.

A pixel electrode 490 is formed on the insulation layer 480. In the present exemplary embodiment, the pixel electrode 490 includes the optically transparent and electrically conductive material. The pixel electrode 490 is electrically connected to the drain electrode DE through the first hole H1 to receive a voltage from the data line DL as transmitted though the switching element TR.

In the present exemplary embodiment, the pixel electrode 490 includes a micro-slit pattern. The micro-slit pattern MS includes an electrode part 491 including the optically transparent and electrically conductive material and an intermediate portion 493 that exposes the insulation layer 480 between adjacent electrode parts 491. In one exemplary embodiment, the width of the electrode part 491 is substantially equal to that of the intermediate portion 493. In one exemplary embodiment, the width of the electrode part 491 may be about 2 µm to about 6 µm.

A first alignment film PL1 is formed on the pixel electrode 490.

When the switching element TR is turned on, a data voltage Vd transferred from the data line DL is applied to the pixel electrode 490. Specifically, when the switching element TR is turned on, a data voltage Vd is transferred from the data line, through the source electrode SE to the switching element TR, which then passes the data voltage Vd to the drain electrode DE, which is connected to the pixel electrode 490.

The pixel electrode 490 may have the micro-slit pattern described above. For example, in one exemplary embodiment the widths of the electrode part 491 and the intermediate portion 493 are about 2 µm to about 10 µm, respectively. In one exemplary embodiment, the width of the electrode part 491 may be substantially equal to or larger than that of the intermediate portion 493.

FIGS. 10A, 11A, 12A, 13A and 14A are top plan layout views of an exemplary embodiment of an array substrate illustrating an exemplary embodiment of a manufacturing process of the exemplary embodiment of an array substrate of FIG. 8, and FIGS. 10B, 11B, 12B, 13B and 14B are cross-sectional views of an exemplary embodiment of an array substrate illustrating an exemplary embodiment of a manufacturing process of the exemplary embodiment of an array substrate of FIG. 9.

Figure 10A:
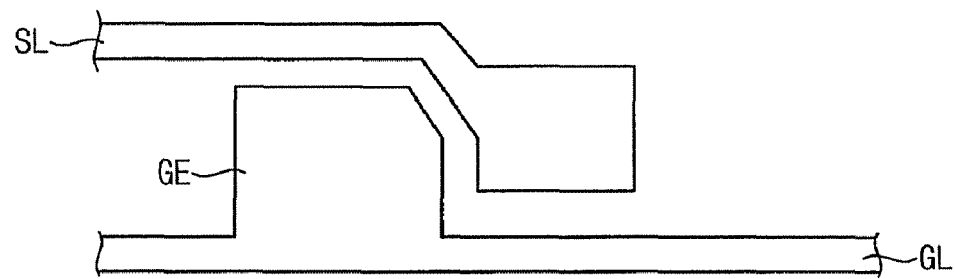
FIGS. 10A, 11A, 12A, 13A and 14A are top plan layout views of an exemplary embodiment of an array substrate illustrating an exemplary embodiment of a manufacturing process of the exemplary embodiment of an array substrate of FIG. 8.
Figure 10B:
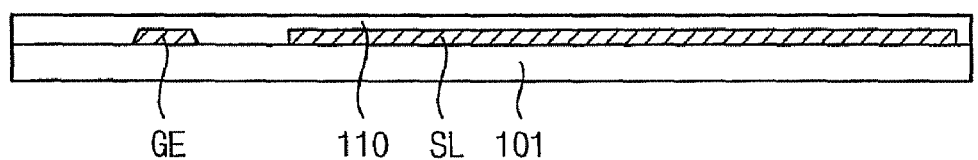
FIGS. 10B, 11B, 12B, 13B and 14B are cross-sectional views of an exemplary embodiment of an array substrate illustrating an exemplary embodiment of a manufacturing process of the exemplary embodiment of an array substrate of FIG. 9.

Referring to FIGS. 10A and 10B, a gate metal layer is deposited on the first base substrate 401, and the gate metal layer is patterned to form a gate metal pattern. The gate metal pattern includes the gate and storage lines GL and SL extending along the first direction and the gate electrode GE of the first switching element TR electrically connected to the gate line GL.

The gate insulation layer 410 is formed on the gate metal pattern. Exemplary embodiments of the gate insulation layer 410 may include silicon nitride (SiNx) and silicon oxide (SiOx). In on exemplary embodiment, the gate insulation layer 410 may be formed to a thickness of about 4,000 Å.

Figure 11A:
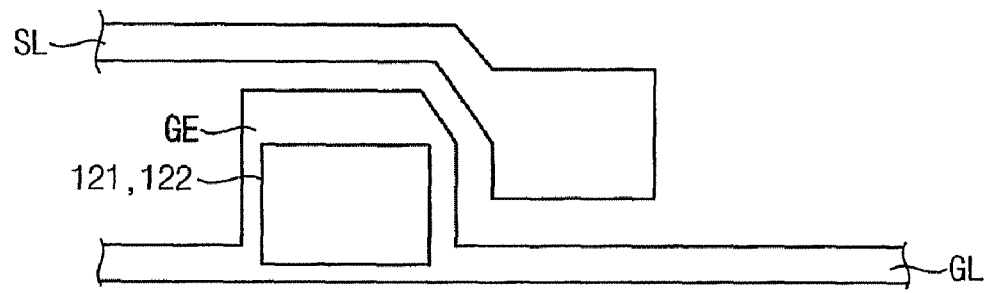
Figure 11B:
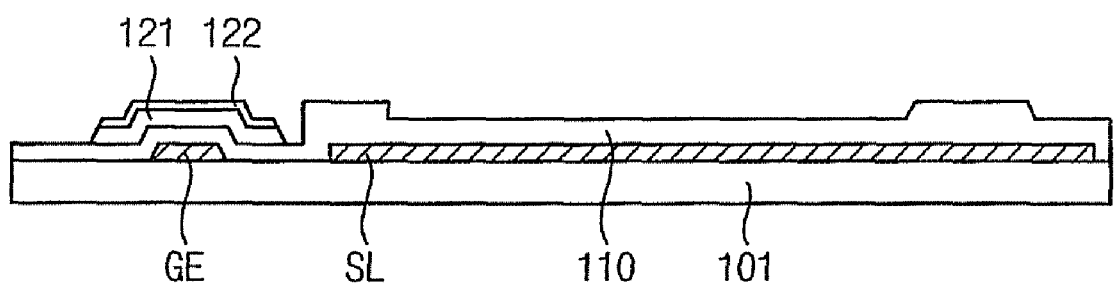

Referring to FIGS. 11A and 11B, a semiconductor layer 421 including amorphous silicon (a-Si) and a channel layer including an ohmic contact layer 422 doped with n+ ions at a high concentration are formed on the gate insulation layer 410.

Figure 12A:
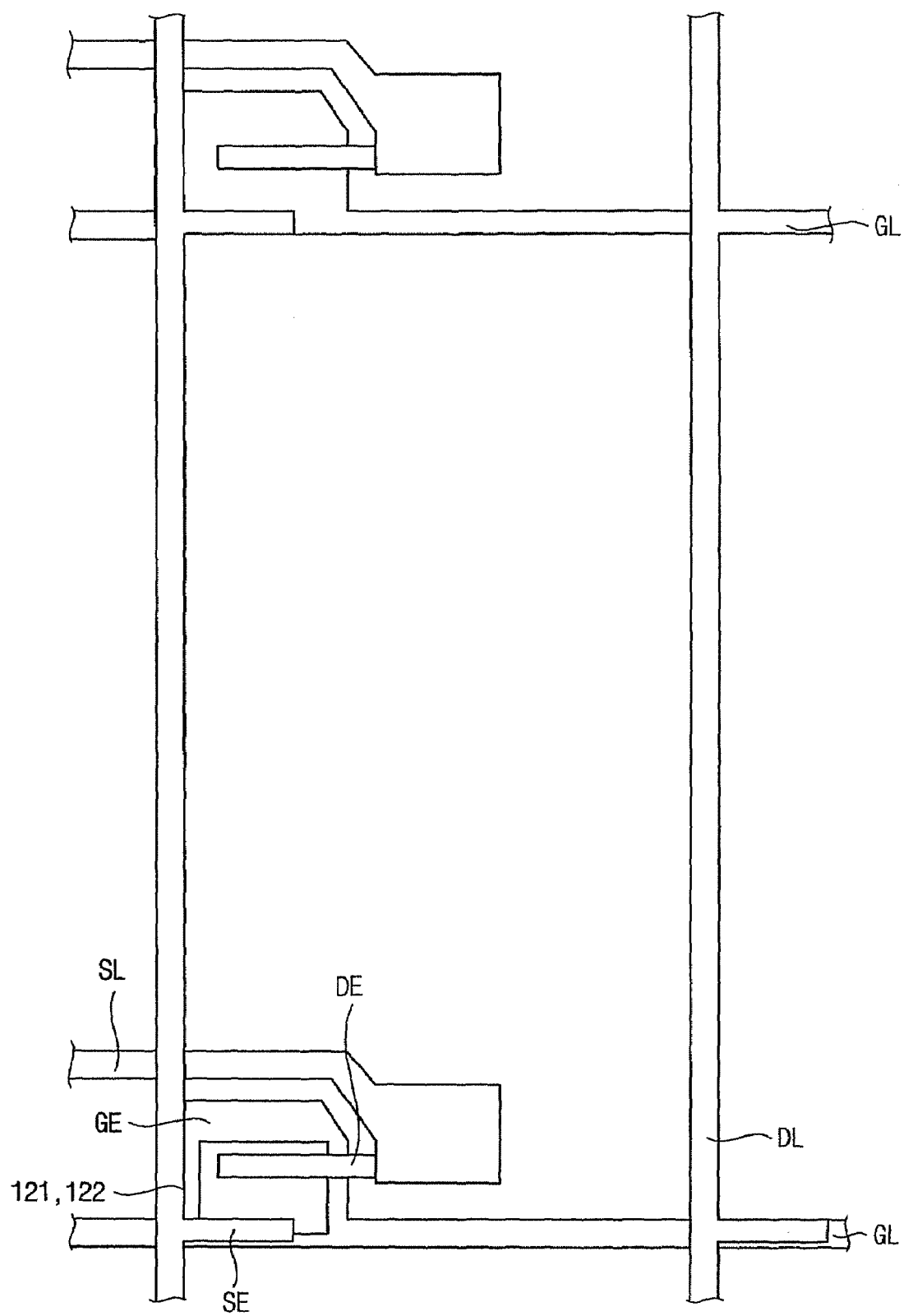
Figure 12B:
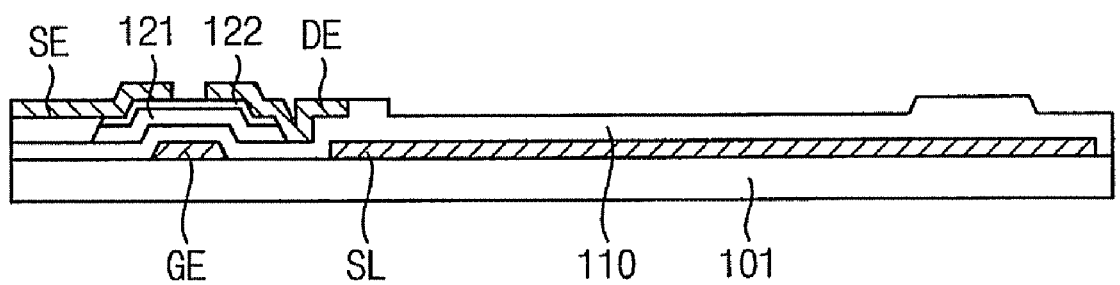

Referring to FIGS. 12A and 12B, a data metal layer is deposited on the gate insulation layer 410 and the semiconductor layer 421, and the data metal layer is patterned to form a data metal pattern. The data metal pattern includes the data line DL extending along the second direction and source/drain electrodes of the switching element TR. The source electrode SE is electrically connected to the data line DL.

A passivation layer 420 is formed on the data metal pattern. In one exemplary embodiment, the passivation layer 420 may include silicon nitride (SiNx). In one exemplary embodiment, the passivation layer 420 may be formed to a thickness of about 2,000 Å.

A TFT layer 450 is formed on the first base substrate 401 through the above manufacturing process.

Figure 13A:
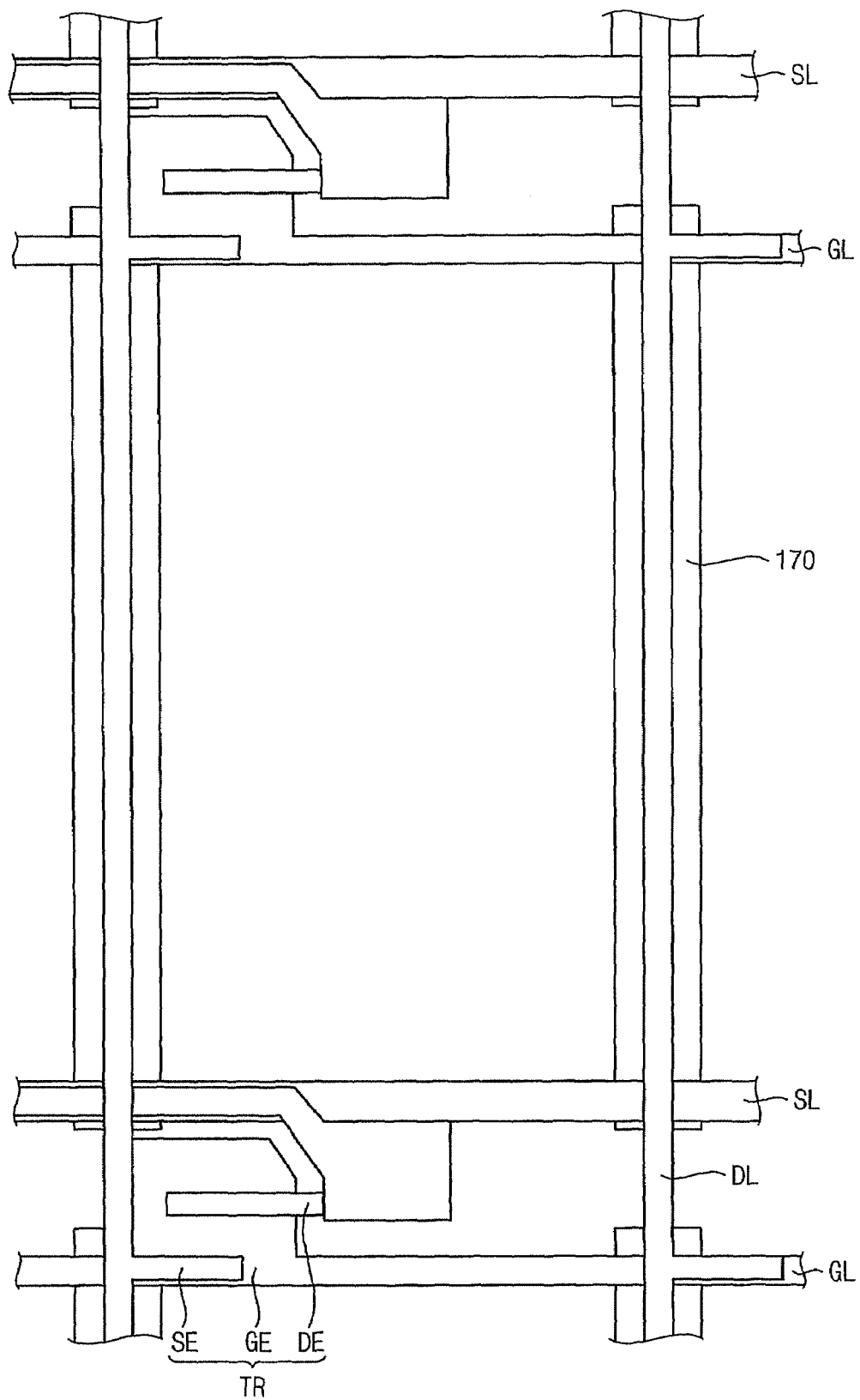
Figure 13B:
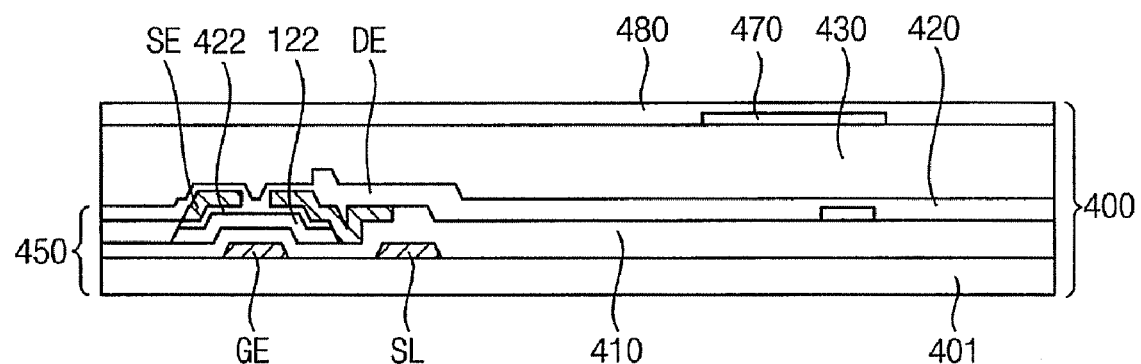

Referring to FIGS. 13A and 13B, the organic layer 430 is formed on the passivation layer 420. An optically transparent and electrically conductive material is deposited on the organic insulation layer 430 and then the optically transparent and electrically conductive material is patterned to form the shielding electrode 470. In one exemplary embodiment, the organic insulation layer 430 may be a thickness of about 4 µm.

The insulation layer 480 is formed on the shielding electrode 470. In one exemplary embodiment, the insulation layer 480 may be formed to a thickness of about 2,000 Å.

Figure 14A:
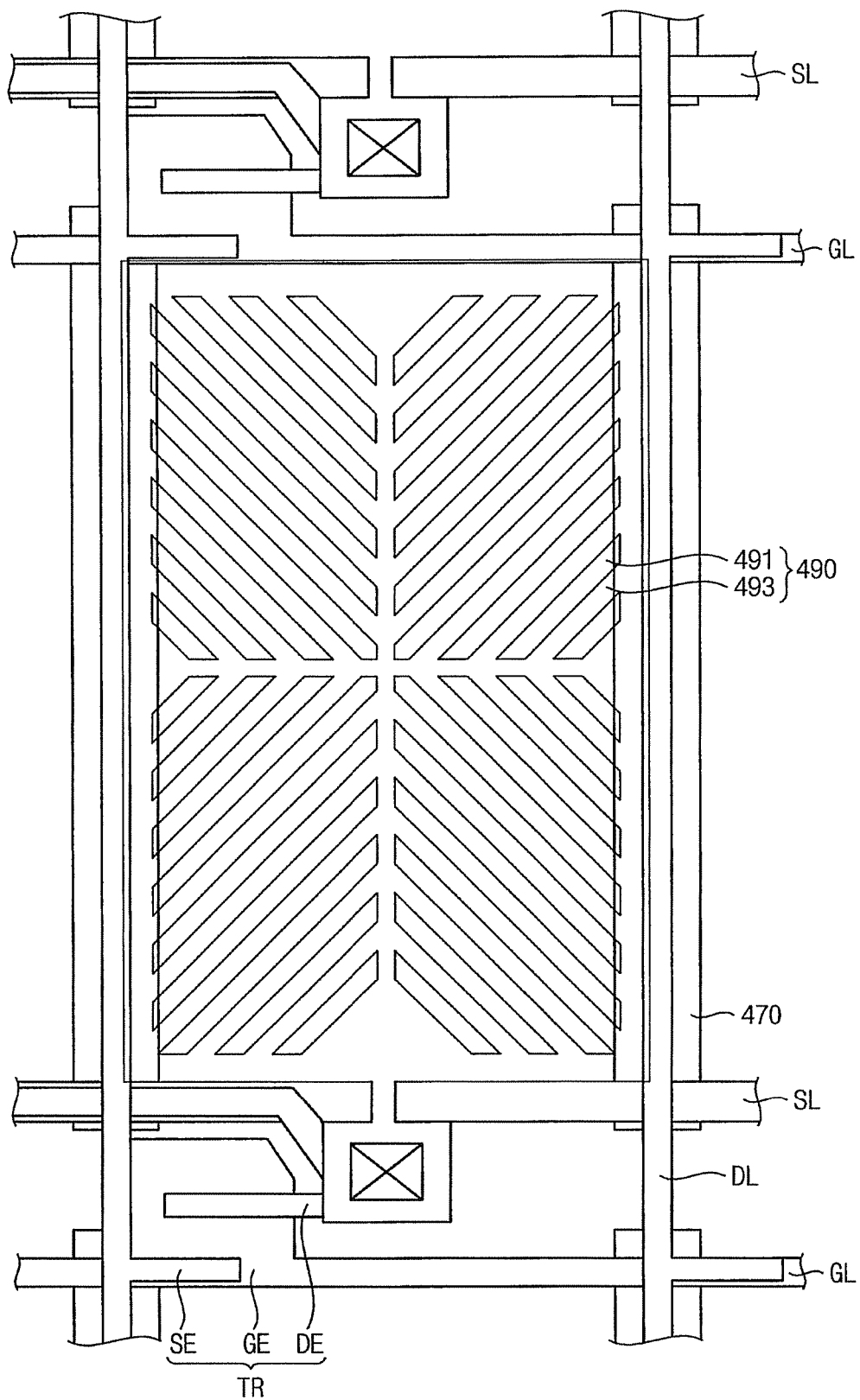
Figure 14B:
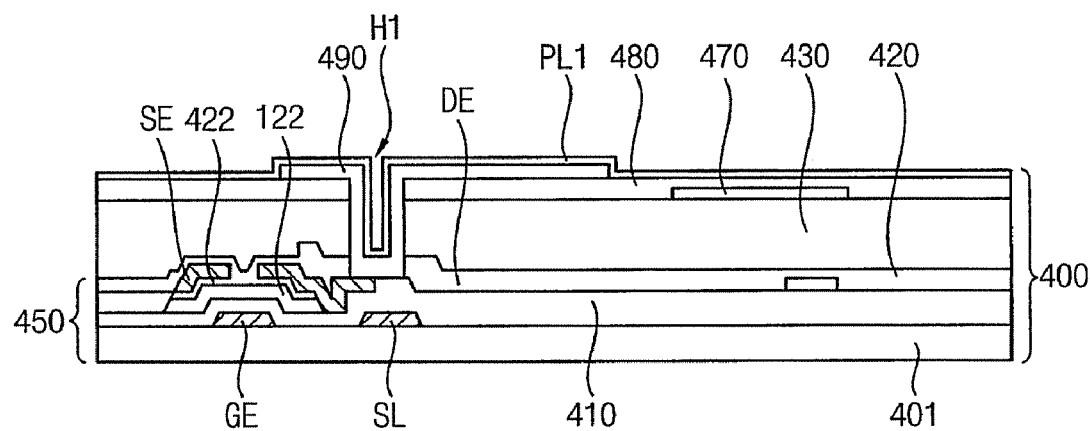

Referring to FIGS. 14A and 14B, the organic layer 430, the insulation layer 480 and the passivation layer 420 corresponding to the first hole H1 are etched to expose the drain electrode DE.

An optically transparent and electrically conductive material is deposited on the insulating layer 480 covering the first hole H1, and then the optically transparent and electrically conductive material is patterned to form the pixel electrode 490. In one exemplary embodiment, the pixel electrode 490 may have a micro-slit pattern. The micro-slit pattern may include an electrode part 491, which may be formed from the optically transparent and electrically conductive material, and an intermediate portion 493 exposing the insulation layer 480 between adjacent electrode parts 491. For example, in one exemplary embodiment, the widths of the electrode part 491 and the intermediate portion 493 are about 2 µm to about 10 µm, respectively. In one exemplary embodiment, the width of the electrode part 491 may be substantially equal to or larger than that of the intermediate portion 493.

The pixel electrode 490 makes contact with the drain electrode DE through the hole H1 to be electrically connected to the switching element TR. The pixel electrode 490 makes contact with the passivation layer 420 through an opening of the shielding electrode 470. Thus, a storage capacitor charging a voltage induced on the liquid crystal layer 300 may be defined between storage line SL and the pixel electrode 490. The storage capacitor may charge predetermined voltages in response to the data voltage Vd applied to the pixel electrode 490 and the common voltage Vcom applied to the storage line SL.

A alignment film PL1 is formed on the pixel electrode 490.

In an exemplary embodiment, in order to form the TFT layer 450, the gate metal layer, the channel layer, the source metal layer and the passivation layer are patterned through four masks. However, alternative exemplary embodiments include configurations wherein the TFT layer 450 may be formed through three masks. For example, in the exemplary embodiment wherein the three masks are used for forming the TFT layer 450, the channel layer and the source metal layer may be patterned through one mask.

Embodiment 3

Figure 15:
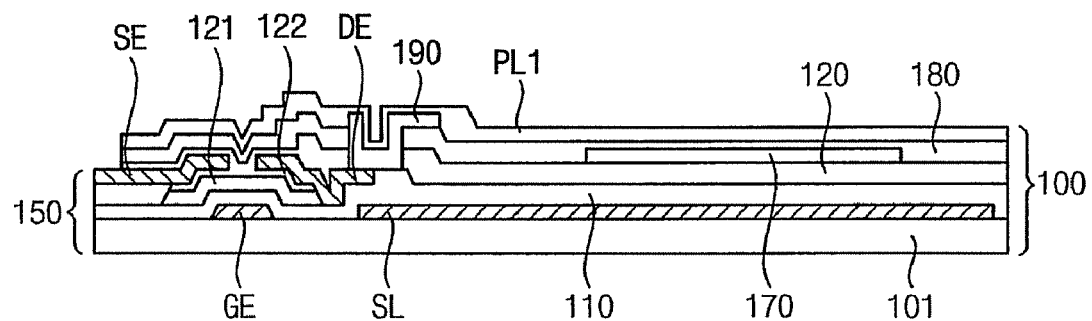
FIG. 15 is a cross-sectional view of another exemplary embodiment of an array substrate according to the present invention.
Figure 16:
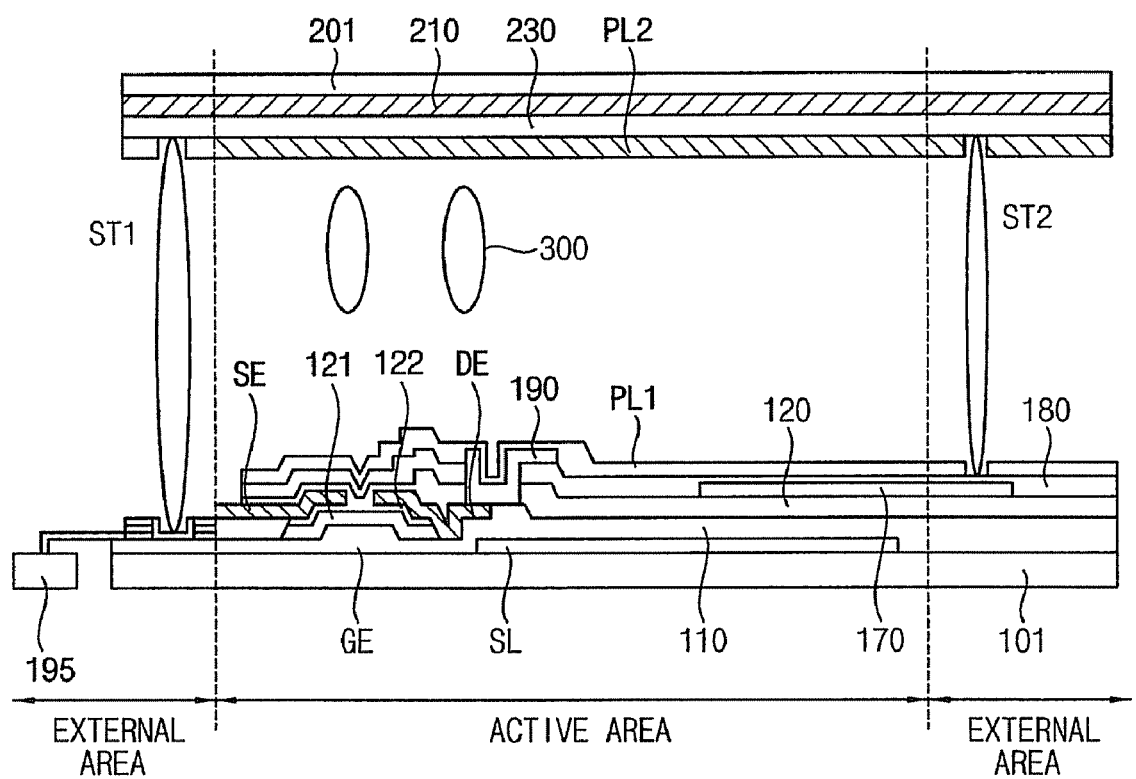
FIG. 16 is a cross-sectional view of another exemplary embodiment of a display panel according to the present invention illustrating an electrical connection of a shielding electrode of FIG. 15.

Another exemplary embodiment of an LCD is described with reference to FIG. 15, which is a cross-sectional view of another exemplary embodiment of an array substrate according to the present invention; and FIG. 16, which is a cross-sectional view of another exemplary embodiment of a display panel according to the present invention illustrating an electrical connection of a shielding electrode of FIG. 15.

The present exemplary embodiment of a display panel is substantially similar to the exemplary embodiment of the display panel described according to an exemplary embodiment as described with respect to FIGS. 1 and 2 except for an electrical connection of the shielding electrode 170 on the array substrate 100. Thus, a detailed description of the similar aspects will be omitted and the electrical connection of the shielding electrode 170 on the array substrate 100 will be described.

In the exemplary embodiment of an LCD described with respect to FIG. 1, the shielding electrode 170 is electrically connected to the storage line SL through the second hole H2 where the passivation layer 120 and the gate insulation layer 110 have an opening. When the common signal is applied to the SL line, the shielding electrode 170 receives a common voltage Vc. The common voltage Vc is substantially equal to a common voltage Vcom applied to a common electrode 230 of the opposite substrate 200. Therefore, the shielding electrode can play a role as a counter electrode of an electromagnetic fringe field from the data line DL or the gate line GL.

However, in the present exemplary embodiment the shielding electrode 170 is connected to the common electrode 230 of the opposite substrate 200 through a short point ST2. The connection is described in FIG. 16 in detail.

For the connection between the short point ST2 from the shielding electrode 170, the second insulation layer 180 and the first alignment film PL1 are etched.

The common voltage Vcom, e.g., a voltage generated from a drive circuit board 195, is induced to the common electrode 230 of the opposite substrate 200 through a short point ST1. The common voltage Vcom on the common electrode 230 is delivered to the shielding electrode 170 through the short point ST2.

The present exemplary embodiment provides an effective way to induce the common voltage Vcom to the shielding electrode 170 with a reduced number of photolithographic processes compared to the previous exemplary embodiments. At least the photolithographic process to form the second hole H2 in the first exemplary embodiment can be omitted by the structure of the present exemplary embodiment.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An array substrate comprising:
a thin-film transistor layer comprising:
  a gate line;
  a data line disposed substantially perpendicular to the gate line; and
  a switching element connected to the gate line and the data line;
a gate insulation layer disposed on the gate line;
a passivation layer disposed on the thin-film transistor layer;
a shielding electrode disposed on the passivation layer;
an insulation layer disposed on the shielding electrode; and
a pixel electrode including a micro-slit pattern, the pixel electrode being disposed on the insulation layer and electrically connected to the switching element,
wherein the shielding electrode is vertically aligned with the data line and the shielding electrode blocks an electromagnetic fringe field of the data line from effecting the pixel electrode.

2. The array substrate of claim 1, wherein the shielding electrode is vertically aligned with the gate line.

3. The array substrate of claim 1, wherein the shielding electrode is vertically aligned with the switching element.

4. The array substrate of claim 1, wherein the shielding electrode is vertically aligned with the micro-slit pattern of the pixel electrode.

5. The array substrate of claim 1, wherein the shielding electrode includes a transparent conductive material.

6. The array substrate of claim 1, wherein the micro-slit pattern comprises an electrode part and an intermediate portion formed between adjacent electrode parts, the widths of the electrode part and the intermediate portion being about 2 μm to about 10 μm, respectively.

7. The array substrate of claim 6, wherein the width of the electrode part is substantially larger than the width of the intermediate portion.

8. The array substrate of claim 1, wherein the shielding electrode is electrically connected to a storage line disposed on substantially a same layer as the gate line.

9. The array substrate of claim 8, wherein the shielding electrode is electrically connected to the storage line via a hole formed through the gate insulation layer and the passivation layer.

10. The array substrate of claim 1, wherein the pixel electrode including the micro-slit pattern is electrically connected to the data line via a hole formed through the insulation layer and the passivation layer.

11. The array substrate of claim 1, wherein the pixel electrode including the micro-slit pattern is electrically connected to a common electrode via a shorting point and a contact hole formed through the insulation layer and an alignment layer.

12. The array substrate of claim 1, further comprising an organic layer disposed on the passivation layer having the shielding electrode formed thereon, wherein the shielding electrode is electrically floated without connection to a voltage signal line.

13. A display panel comprising:
an array substrate including:
  a thin-film transistor layer including:
    a gate line;
    a data line disposed substantially perpendicular to the gate line; and
    a switching element connected to the gate line and the data line;
  a storage line disposed on substantially a same layer as the gate line;
  a gate insulation layer disposed on the gate line and the storage line;
  a passivation layer disposed on the thin-film transistor layer;
  a shielding electrode disposed on the gate insulation layer; and
  an insulation layer disposed on the shielding electrode; and
  a pixel electrode including a micro-slit pattern, the pixel electrode being disposed on the second insulation layer and electrically connected to the switching element,
  wherein the shielding electrode is vertically aligned with the data line and the shielding electrode blocks an electromagnetic fringe field of the data line from effecting the pixel electrode;
an opposite substrate coupled to the array substrate, the opposite substrate including a common electrode disposed substantially opposite to the pixel electrode; and a liquid crystal layer interposed between the opposite substrate and the array substrate.

14. The array substrate of claim 13, wherein the shielding electrode is vertically aligned with the gate line and the switching element.

15. The array substrate of claim 13, wherein the shielding electrode is vertically aligned with the micro-slit pattern of the pixel electrode.

16. The array substrate of claim 13, wherein the shielding electrode includes a transparent conductive material.

17. The array substrate of claim 13, wherein the shielding electrode is electrically connected to the storage line via a hole formed through the gate insulation layer and the passivation layer.

18. The array substrate of claim 13, wherein the pixel electrode including the micro-slit pattern is electrically connected to the data line via a hole formed through the insulation layer and the passivation layer.

19. The array substrate of claim 13, wherein the shielding electrode is electrically connected to the common electrode of the opposite substrate via a conductive material disposed across the liquid crystal layer.

20. A method of manufacturing an array substrate, the method comprising:

forming a thin-film transistor layer, the forming of a thin-film transistor comprising:
providing a gate line;
disposing a data line substantially perpendicular to the gate line; and
connecting a switching element to the gate line and the data line;
disposing a gate insulation layer on the gate line;
disposing a passivation layer on the thin-film transistor layer;
disposing a shielding electrode on the passivation layer;
disposing an insulation layer on the shielding electrode; and
disposing a pixel electrode including a micro-slit pattern on the insulation layer and electrically connecting the pixel electrode to the switching element;
wherein the shielding electrode is vertically aligned with the data line and the shielding electrode blocks an electromagnetic fringe field of the data line from effecting the pixel electrode.

* * * * *